US012797903B2

(12) United States Patent
Jiang et al.

(10) Patent No.: US 12,797,903 B2
(45) Date of Patent: Nov. 17, 2026

(54) ULTRASONIC SENSOR AND MANUFACTURING METHOD THEREOF

(71) Applicant: QISDA CORPORATION, Taoyuan City (TW)

(72) Inventors: Fu-Sheng Jiang, Taoyuan City (TW); Pei-Lun Song, Taoyuan City (TW)

(73) Assignee: QISDA CORPORATION, Taoyuan City (TW)

( * ) Notice: Subject to any disclaimer, the term of this patent is extended or adjusted under 35 U.S.C. 154(b) by 170 days.

(21) Appl. No.: 18/908,783

(22) Filed: Oct. 7, 2024

(65) Prior Publication Data

US 2025/0128288 A1 Apr. 24, 2025

(30) Foreign Application Priority Data

Oct. 24, 2023 (TW) ................................. 112140616

(51) Int. Cl.
*B06B 1/02* (2006.01)
*B81B 3/00* (2006.01)
*B81C 1/00* (2006.01)

(52) U.S. Cl.
CPC .......... *B06B 1/0292* (2013.01); *B81B 3/0021* (2013.01); *B81C 1/00134* (2013.01); *B81B 2201/0271* (2013.01); *B81B 2203/0315* (2013.01); *B81C 2201/013* (2013.01)

(58) Field of Classification Search
CPC .......... B81B 3/0021; B81B 2201/0271; B81B 2203/0315; B81C 1/00134
See application file for complete search history.

(56) References Cited

U.S. PATENT DOCUMENTS

| | | | | |
|---|---|---|---|---|
| 2015/0032002 | A1* | 1/2015 | Rothberg | A61B 8/4488 600/440 |
| 2018/0161813 | A1* | 6/2018 | Hasegawa | H04R 31/00 |
| 2019/0366382 | A1* | 12/2019 | Akiyama | B06B 1/0215 |

FOREIGN PATENT DOCUMENTS

| | | | | |
|---|---|---|---|---|
| CN | 112130703 A | * 12/2020 | | G06V 40/1306 |
| JP | 2016063499 A | * 4/2016 | | |

OTHER PUBLICATIONS

Daya et al., Compensated Row-Column Ultrasound Imaging System Using Multilayered Edge Guided Stochastically Fully Connected Random Fields, Scientific Reports, Sep. 6, 2017, www.nature.com.

* cited by examiner

*Primary Examiner* — Abdallah Abulaban
(74) *Attorney, Agent, or Firm* — Winston Hsu

(57) ABSTRACT

An ultrasonic sensor has a capacitance micromachined ultrasonic transducer (CMUT) with three metal layers and four insulating layers. A first metal layer receives a reference voltage, a second metal layer receives a direct current voltage, and a third metal layer receives an alternating current voltage. A cavity formed between the first metal layer and the second metal layer allows for mechanical vibration of the CMUT, which generates ultrasonic waves.

6 Claims, 7 Drawing Sheets

ULTRASONIC SENSOR AND MANUFACTURING METHOD THEREOF

BACKGROUND OF THE INVENTION

1. Field of the Invention

The invention relates to an ultrasonic sensor and a manufacturing method thereof, and in particular to an ultrasonic sensor having a capacitance micromachined ultrasonic transducer (CMUT) and a manufacturing method thereof.

2. Description of the Prior Art

A capacitive micromachined ultrasonic transducer (CMUT) is a type of ultrasonic transducer that uses the principle of capacitance to generate and detect ultrasound waves. A CMUT has a ground electrode and a membrane, with another electrode located in the membrane. When the CMUT is in a transmission mode, the ground electrode is grounded and the electrode in the membrane is applied with a direct-current (DC) voltage and an alternating-current (AC) voltage. The DC voltage causes the membrane to deflect towards the ground electrode, while the AC voltage causes the membrane to vibrate, generating ultrasound waves. However, if only an AC voltage is applied, the vibration of the membrane will not be large enough. Therefore, in order to generate a sufficiently large vibration of the membrane, both a DC voltage and an AC voltage must be applied. However, since both the DC voltage and the AC voltage are applied to the same electrode in the membrane, they cannot be controlled separately.

When the CMUT is in a receive mode, the ground electrode is grounded and the electrode in the membrane is applied with a DC voltage. The distance between the membrane and the ground electrode changes due to the ultrasound waves, which causes a corresponding change in the capacitance between the membrane and the ground electrode and the amount of charges stored on the electrode in the membrane. This in turn causes the electrode in the membrane to output a corresponding AC voltage. However, if no DC voltage is applied to the electrode in the membrane when the CMUT is in the receive mode, the membrane will not be able to generate a sufficiently large vibration in the receive mode of the CMUT, which will result in an insufficient amplitude of the AC voltage output by the electrode in the membrane, increasing the difficulty of measurement. Therefore, in order for the membrane to generate a sufficiently large vibration in the receive mode of the CMUT, a DC voltage must be applied to the electrode in the membrane. However, since the DC voltage and the output of the AC voltage are both applied through the same electrode in the membrane, and there is a certain switching time required for the electrode in the membrane to switch from a state where a DC voltage is applied to another state where no DC voltage is applied, if the switching of the states cannot be completed immediately, it will cause serious distortion of the CMUT image.

SUMMARY OF THE INVENTION

An embodiment of the present invention provides an ultrasonic sensor. The ultrasonic sensor comprises a substrate, a first metal layer, a first insulating layer, a second insulating layer, a second metal layer, a third insulating layer, a third metal layer, and a fourth insulating layer. The first metal layer is formed on the substrate. A first portion of the first metal layer is used to receive a reference voltage. The first insulating layer is formed on the first metal layer. A first cavity is formed between the second insulating layer and the first insulating layer. The second metal layer is formed on the second insulating layer. A first portion of the second metal layer is used to receive a direct-current (DC) voltage different from the reference voltage. The third insulating layer is formed on the second metal layer. The third metal layer is formed on the third insulating layer. A first portion of the third metal layer is used to receive an alternating-current (AC) voltage. The fourth insulating layer is formed on the third metal layer. The first portion of the first metal layer, the first cavity, the first portion of the second metal layer, and the first portion of the third metal layer form a capacitance micromachined ultrasonic transducer (CMUT).

An embodiment of the present invention provides a method for manufacturing an ultrasonic sensor. The method comprises providing a substrate; forming a first metal layer on the substrate, the first metal layer comprising a first portion and a second portion; forming a first insulating layer on the first metal layer; forming a semiconductor layer on the substrate and the second portion of the first metal layer; forming a first sacrificial layer on the first insulating layer; forming a second insulating layer on the first sacrificial layer; removing the first sacrificial layer to form a first cavity between the first insulating layer and the second insulating layer; forming a second metal layer on the second insulating layer; forming a third insulating layer on the second metal layer; forming a third metal layer on the third insulating layer; and forming a fourth insulating layer on the third metal layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
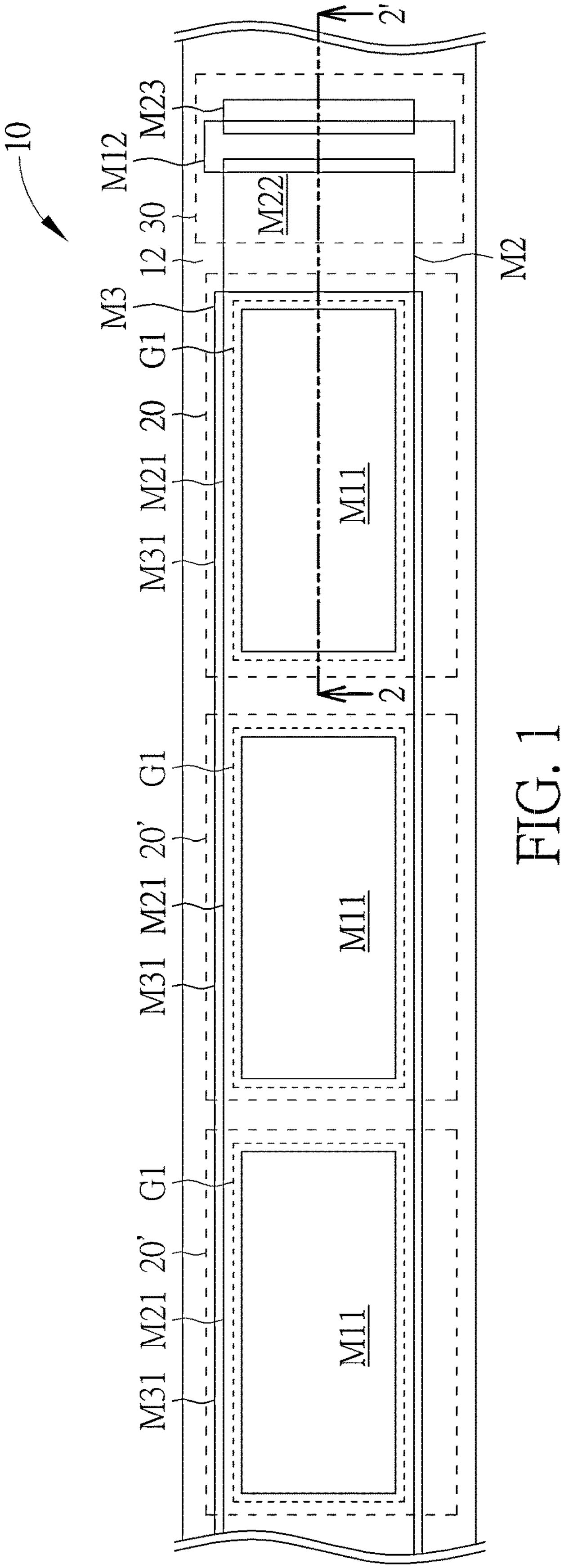
FIG. 1 is a top view of an ultrasonic sensor in accordance with an embodiment of the present invention.

The present invention can be understood by referring to the following detailed description and the accompanying drawings. It should be noted that in order to make it easier for the reader to understand and for the sake of simplicity of the drawings, only a portion of the electronic device is shown in many of the drawings in the present invention, and the specific components in the drawings are not drawn to scale. In addition, the number and size of the components in the drawings are only for illustration purposes and do not limit the scope of the present invention.

Certain terms will be used throughout the specification and in the appended claims to refer to specific components. It should be understood by those skilled in the art that different names may be used by different manufacturers of electronic devices to refer to the same component. It is not intended herein to distinguish between components that are different in name but identical in function. In the following description and claims, the terms "comprising" and "including" are open-ended terms and should be interpreted as meaning "comprising but not limited to . . . ".

It should be understood that when a component or layer is referred to as being "on" another component or layer, "disposed on" another component or layer, or "connected to" another component or layer, it may be directly on or directly connected to the other component or layer, or there may be intervening components or layers (non-direct case) between the two. Conversely, when a component is referred to as being "directly on" another component or layer, "directly disposed on" another component or layer, or "directly connected to" another component or layer, there are no intervening components or layers between the two.

Electrical connection can be direct or indirect. Electrical connection of two components can be by direct contact to transmit electrical signals, with no other components between them. Electrical connection of two components can be through a conductive medium between them to transmit electrical signals. Coupling of two components can be without a conductive medium between the two components, but the two components can form a capacitance through a medium.

Although the terms first, second, third, etc. may be used to describe a plurality of components, the components are not limited to these terms. These terms are used only to distinguish a single component from other components in the specification. The same terms may not be used in the claims, and the first, second, third, etc. may be replaced by the order in which the components are claimed. Therefore, the first component in the following description may be the second component in the claims.

Figure 2:
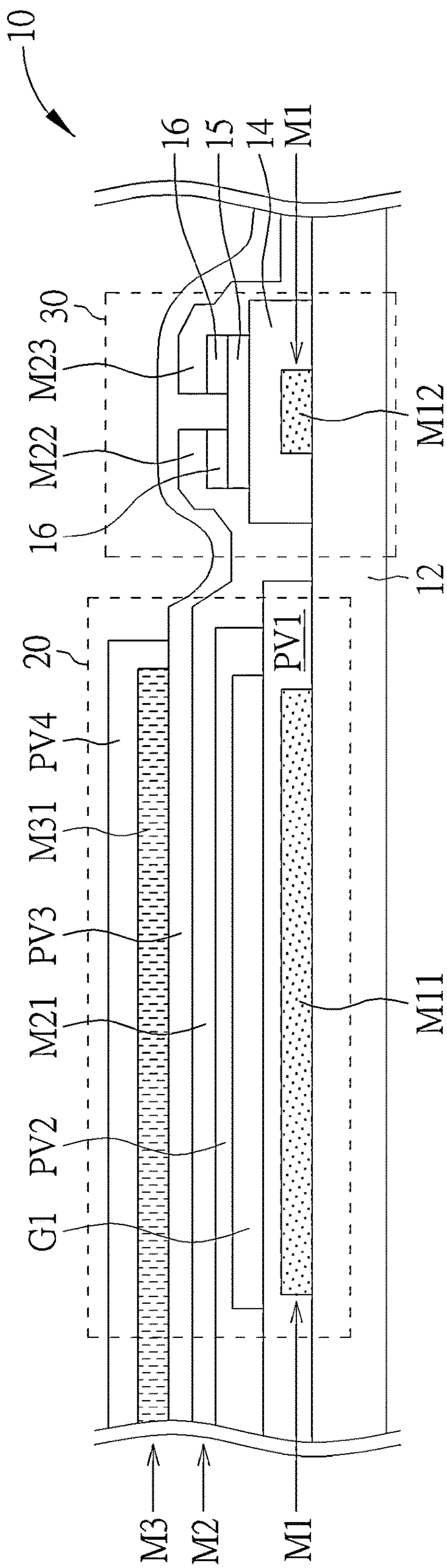
FIG. 2 is a cross-sectional view of the ultrasonic sensor shown in FIG. 1, taken along section line 2-2'.

Please refer to FIGS. 1 and 2. FIG. 1 is a top view of an ultrasonic sensor 10 according to an embodiment of the present invention, and FIG. 2 is a cross-sectional view of the ultrasonic sensor along section line 2-2' in FIG. 1. The ultrasonic sensor 10 comprises a substrate 12, a first metal layer M1, a first insulating layer PV1, a second insulating layer PV2, a second metal layer M2, a third insulating layer PV3, a third metal layer M3, and a fourth insulating layer PV4. The first metal layer M1 is formed on the substrate 12, and the first metal layer M1 can be divided into a plurality of portions, e.g., a first portion M11 and a second portion M12, by etching. The first insulating layer PV1 is formed on the first metal layer M1, and a first cavity G1 is formed between the second insulating layer PV2 and the first insulating layer PV1. The second metal layer M2 is formed on the second insulating layer PV2, and the second metal layer M2 can be divided into a plurality of portions, e.g., a first portion M21, a second portion M22, and a third portion M23, by etching. The third insulating layer PV3 is formed on the second metal layer M2. The third metal layer M3 is formed above the third insulating layer PV3. After etching, one or more required portions, e.g., a first portion M31, of the third metal layer M3 can be retained. The fourth insulating layer PV4 is formed on the third metal layer M3. The first portion M11 of the first metal layer M1, the first cavity G1, the first portion M21 of the second metal layer M2, and the first portion M31 of the third metal layer M3 form a capacitance micromachined ultrasonic transducer (CMUT) 20 of the ultrasonic sensor 10. As shown in FIG. 1, the first portion M11 of the first metal layer M1, the first portion M21 of the second metal layer M2, the first portion M31 of the third metal layer M3, and the first cavity G1 at least partially overlap along a vertical direction.

In an embodiment of the present invention, the ultrasonic sensor 10 further comprises a semiconductor layer 15, which is formed between the substrate 12 and the second metal layer M2. The semiconductor layer 15, the second portion M12 of the first metal layer M1, the second portion M22 of the second metal layer M2, and the third portion M23 of the second metal layer M2 form a thin-film transistor (TFT) 30. An insulating layer 14 is formed between the second portion M12 of the first metal layer M1 and the semiconductor layer 15. An ohmic contact layer 16 is respectively formed between the semiconductor layer 15 and the second portion M22 of the second metal layer M2, as well as between the semiconductor layer 15 and the third portion M23 of the second metal layer M2. The second portion M12 of the first metal layer M1 constitutes the gate of the thin-film transistor 30, the second portion M22 of the second metal layer M2 constitutes the drain of the thin-film transistor 30, and the third portion M23 of the second metal layer M2 constitutes the source of the thin-film transistor 30.

Figure 3:
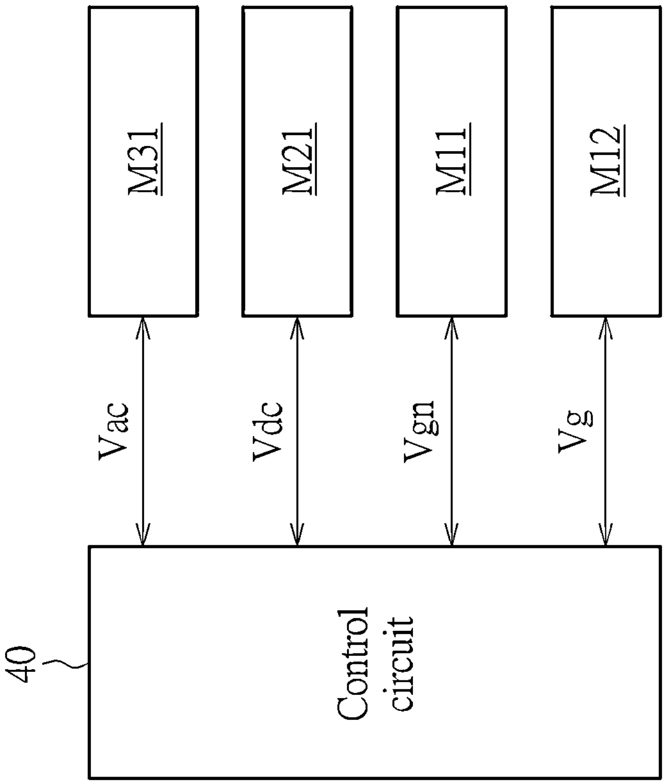
FIG. 3 is a schematic diagram illustrating the connection between the control circuit and the corresponding metal layers of the ultrasonic sensor shown in FIG. 1.

Please refer to FIG. 3, in conjunction with FIG. 2. FIG. 3 is a schematic diagram illustrating the connection between the control circuit 40 and the corresponding metal layers of the ultrasonic sensor 10 shown in FIG. 1. The control circuit 40 generates a control signal Vg, a reference voltage Vgn, a direct-current (DC) voltage Vdc, and an alternating-current (AC) voltage Vac. The control signal Vg is applied to the second portion M12 of the first metal layer M1 to control the electrical connection between the second portion M22 and the third portion M23 of the second metal layer M2. The reference voltage Vgn can be a ground voltage, and the reference voltage Vgn is not equal to the DC voltage Vdc. The reference voltage Vgn is applied to the first portion M11 of the first metal layer M1. The DC voltage Vdc is applied to the first portion M21 of the second metal layer M2, and the AC voltage Vac is applied to the first portion M31 of the third metal layer M3.

When the ultrasonic sensor 10 is in the transmission mode, the reference voltage Vgn is applied to the first portion M11 of the first metal layer M1, the DC voltage Vdc is applied to the first portion M21 of the second metal layer M2, and the control signal Vg is applied to the second portion M12 of the first metal layer M1 to turn on the thin-film transistor 30, thereby making the second portion M22 of the second metal layer M2 electrically connected to the third portion M23 of the second metal layer M2. Due to the turned on thin-film transistor 30, the DC voltage Vdc will be transmitted to the first portion M21 of the second metal layer M2 through the third portion M23 and the second portion M22 of the second metal layer M2. At this time, because the first portion M21 of the second metal layer M2 is applied with DC voltage Vdc, the first portion M21 of the second metal layer M2 will approach the first portion M11 of the first metal layer M1, causing the first portion M21 of the second metal layer M2 to bend. Then, the AC voltage Vac is applied to the first portion M31 of the third metal layer M3, causing the first portion M21 of the second metal layer M2 and the first portion M31 of the third metal layer M3 to vibrate, thereby generating sound waves. Since the thin-film transistor 30 can be used to control whether the DC voltage Vdc is supplied to the first portion M21 of the second metal layer M2, when it is necessary to end the transmission mode of the ultrasonic sensor 10, the thin-film transistor 30 can be turned off to immediately stop supplying the DC voltage Vdc to the first portion M21 of the second metal layer M2. When the first portion M21 of the second metal layer M2 is not provided with the DC voltage Vdc, even if the first portion M31 of the third metal layer M3 may still receive other noise or the AC voltage Vac, the vibration generated by the first portion M21 of the second metal layer M2 and the first portion M31 of the third metal layer M3 will be very small and can be ignored. In an embodiment of the present invention, when it is necessary to end the transmission mode of the ultrasonic sensor 10, the control circuit 40 will simultaneously turn off the thin-film transistor 30 and stop supplying the AC voltage Vac to the first portion M31 of the third metal layer M3. Since the DC voltage Vdc and the AC voltage Vac are respectively applied to the first portion M21 of the second metal layer M2 and the first portion M31 of the third metal layer M3, and the DC voltage Vdc is supplied to the first portion M21 of the second metal layer M2 through the thin-film transistor 30, the timing of applying the DC voltage Vdc and the AC voltage Vac can be accurately controlled, so that the ultrasonic sensor 10 can generate sound waves more accurately.

When the ultrasonic sensor 10 is in the receive mode, the reference voltage Vgn is applied to the first portion M11 of the first metal layer M1, the DC voltage Vdc is applied to the first portion M21 of the second metal layer M2, and the control signal Vg is applied to the second portion M12 of the first metal layer M1 to turn on the thin-film transistor 30, thereby making the second portion M22 of the second metal layer M2 electrically connected to the third portion M23 of the second metal layer M2. Due to the turned on thin-film transistor 30, the DC voltage Vdc will be transmitted to the first portion M21 of the second metal layer M2 through the third portion M23 and the second portion M22 of the second metal layer M2. At this time, the first portion M31 of the third metal layer M3 can be used to sense external sound waves. Furthermore, the distance between the first portion M31 of the third metal layer M3 and the first portion M11 of the first metal layer M1 changes due to external sound waves, which causes the capacitance value between the first portion M31 of the third metal layer M3 and the first portion M11 of the first metal layer M1 and the amount of charges stored in the first portion M31 of the third metal layer M3 to change correspondingly, thereby causing the first portion M31 of the third metal layer M3 to output a corresponding alternating-current (AC) voltage. Therefore, by detecting the change in the AC voltage output by the first portion M31 of the third metal layer M3, the ultrasonic sensor 10 can complete the corresponding ultrasonic imaging. Since the thin-film transistor 30 can be used to control whether the DC voltage Vdc is supplied to the first portion M21 of the second metal layer M2, when it is necessary to end the receive mode of the ultrasonic sensor 10, the thin-film transistor 30 can be turned off to immediately stop supplying the DC voltage Vdc to the first portion M21 of the second metal layer M2. When the first portion M21 of the second metal layer M2 is not provided with DC voltage Vdc, even if the first portion M31 of the third metal layer M3 may still receive subsequent external sound waves, the vibration generated by the first portion M31 of the third metal layer M3 will be very small and can be ignored. Since the DC voltage Vdc and the AC voltage Vac are respectively applied to the first portion M21 of the second metal layer M2 and the first portion M31 of the third metal layer M3, and the DC voltage Vdc is supplied to the first portion M21 of the second metal layer M2 through the thin-film transistor 30, the timing of applying the DC voltage Vdc can be accurately controlled, so that the ultrasonic sensor 10 can receive sound waves more accurately, thereby improving the signal-to-noise ratio (SNR) of the ultrasonic sensor 10.

Please refer again to FIG. 1. In an embodiment of the present invention, the ultrasonic sensor 10 may further comprise a plurality of capacitance micromachined ultrasonic transducers (CMUTs) 20'. The structure of each CMUT 20' is the same as that of the CMUT 20. In the CMUT 20 and the plurality of CMUTs 20', the first portions M11 are formed in the first metal layer M1, the first portions M21 are formed in the second metal layer M2, and the first portions M31 are formed in the third metal layer M3. Each CMUT 20' also comprises a first cavity G1 formed between the first metal layer M1 and the second metal layer M2. The ultrasonic sensor 10 can simultaneously control the CMUT 20 and the plurality of CMUTs 20', causing the CMUT 20 and the plurality of CMUTs 20' to simultaneously generate sound waves or output an AC voltage generated by receiving sound waves. When the thin-film transistor 30 is turned on, the DC voltage Vdc will be applied to the first portions M21 of the CMUT 20 and the plurality of CMUTs 20' through the second metal layer M2. In addition, when the ultrasonic sensor 10 is in the transmission mode, the AC voltage Vac is applied to the first portions M31 of the CMUT 20 and the plurality of CMUTs 20' through the third metal layer M3. When the ultrasonic sensor 10 is in the receive mode, the CMUT 20 and the plurality of CMUTs 20' will output an AC voltage generated by receiving sound waves through the third metal layer M3.

Figure 4:
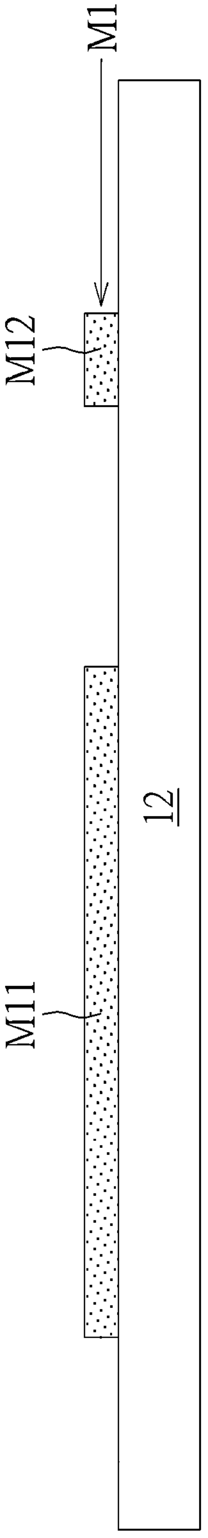
FIGS. 4 to 11 are schematic diagrams used to illustrate the processes of manufacturing an ultrasonic sensor in accordance with an embodiment of the present invention.
Figure 5:
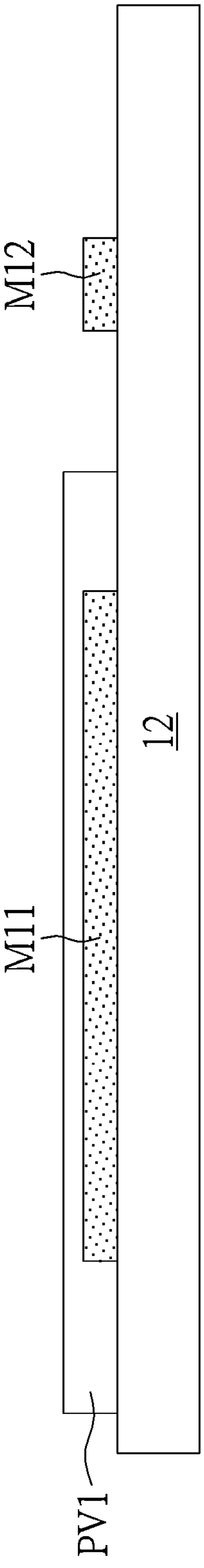
Figure 6:
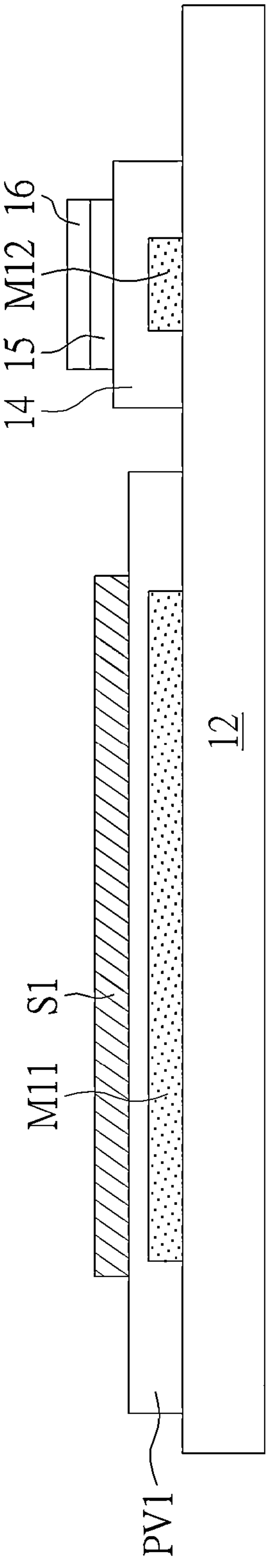
Figure 7:
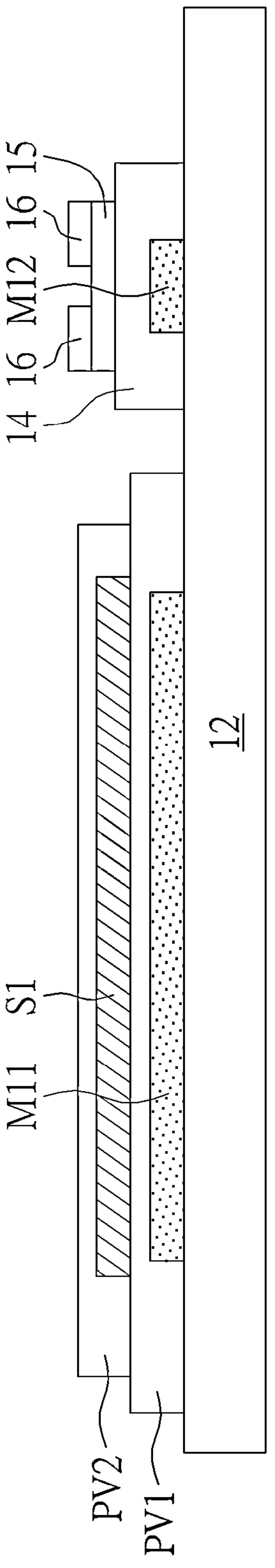
Figure 8:
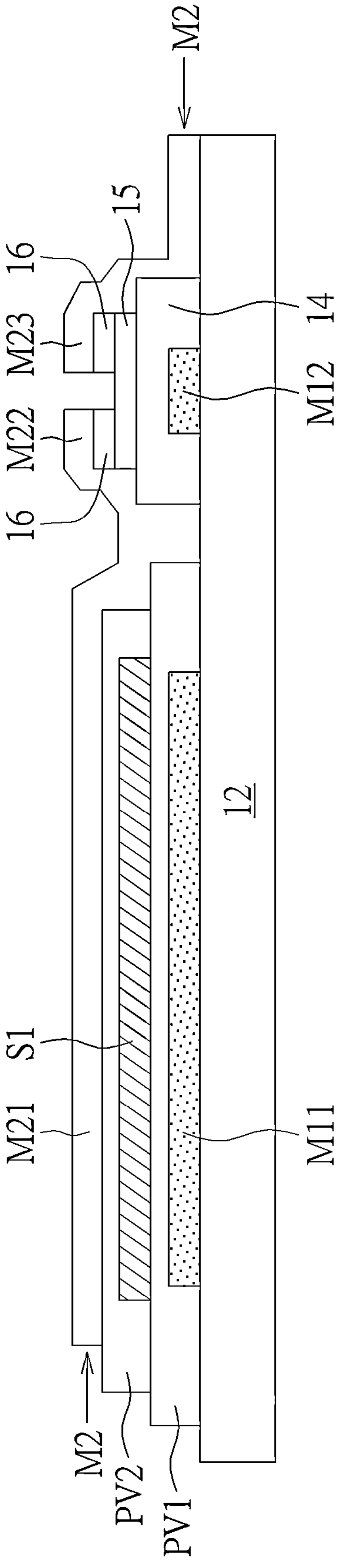
Figure 9:
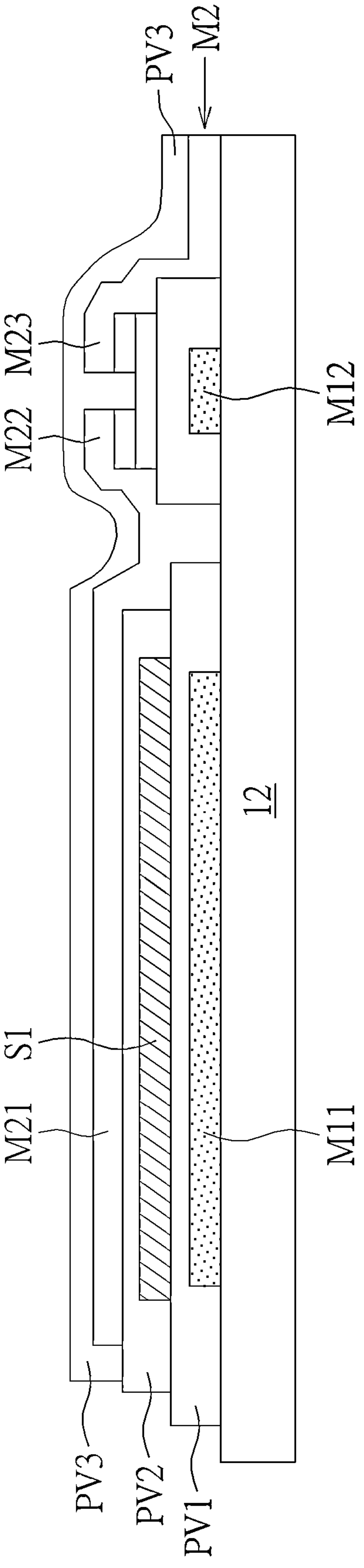
Figure 10:
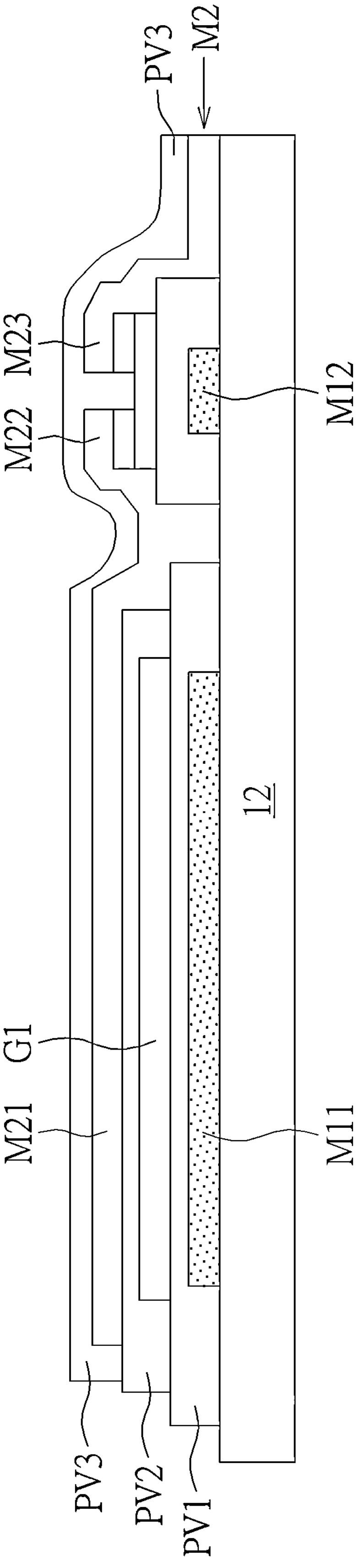
Figure 11:
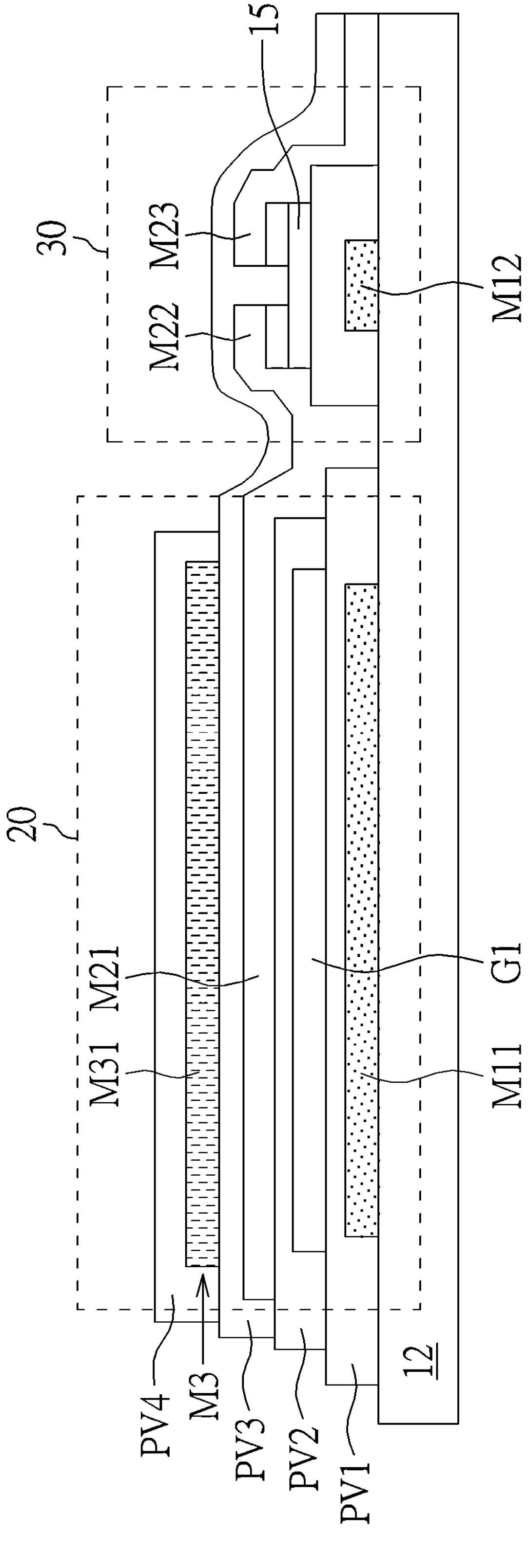

Please refer to FIGS. 4 to 11, which are schematic diagrams used to illustrate the processes of manufacturing an ultrasonic sensor in accordance with an embodiment of the present invention. First, the substrate 12 is provided, and the first metal layer M1 is formed on the substrate 12. Then, by etching the first metal layer M1, the first portion M11 and the second portion M12 of the first metal layer M1 are formed (as shown in FIG. 4). Afterwards, as shown in FIG. 5, the first insulating layer PV1 is formed on the first metal layer M1. Then, as shown in FIG. 6, the insulating layer 14, the semiconductor layer 15, and the ohmic contact layer 16 are formed on the substrate 12 and the second portion M12 of the first metal layer M1, and a first sacrificial layer S1 is formed on the first insulating layer PV1. In the embodiment, the insulating layer 14, the semiconductor layer 15, and the ohmic contact layer 16 can be formed first, and then the first sacrificial layer S1 is formed; or the first sacrificial layer S1 is formed first, and then the insulating layer 14, the semiconductor layer 15, and the ohmic contact layer 16 are formed. In addition, in an embodiment of the present invention, the insulating layer 14 and the first insulating layer PV1 can be formed simultaneously. Afterwards, as shown in FIG. 7, the second insulating layer PV2 is formed on the first sacrificial layer S1, and a local etching is performed on the ohmic contact layer 16. In the embodiment, the second insulating layer PV2 may be formed first, and then a local etching is performed on the ohmic contact layer 16; or a local etching is performed on the ohmic contact layer 16 first, and then the second insulating layer PV2 is formed. Then, as shown in FIG. 8, the second metal layer M2 is formed on the second insulating layer PV2 and the ohmic contact layer 16, and the second metal layer M2 is etched to separate the second portion M22 and the third portion M23 of the second metal layer M2. Then, as shown in FIG. 9, the third insulating layer PV3 is formed on the second metal layer M2. Afterwards, as shown in FIG. 10, the first sacrificial layer S1 is removed to form the first cavity G1 between the first insulating layer PV1 and the second insulating layer PV2. In order to remove the first sacrificial layer S1, a hole communicating with the space where the first sacrificial layer S1 is located can be formed in the third insulating layer PV3 and the second insulating layer PV2, and then an etching material (such as hydrochloric acid, nitric acid, sulfuric acid, etc.) can be used to etch the first sacrificial layer S1 through the hole, to remove the first sacrificial layer S1, and thereby form the first cavity G1. Then, as shown in FIG. 11, the third metal layer M3 is formed above the third insulating layer PV3, and the fourth insulating layer PV4 is formed on the third metal layer M3. The materials of the first insulating layer PV1, the second insulating layer PV2, the third insulating layer PV3, the fourth insulating layer PV4, and the insulating layer 14 can be, but are not limited to, silicon oxide ($SiO_2$), silicon nitride ($SiN_x$), hafnium oxide ($HfO_2$), zirconium oxide ($ZrO_2$), and tantalum oxide ($Ta_2O_5$). The materials of the first metal layer M1, the second metal layer M2, the third metal layer M3, and the first sacrificial layer S1 can be, but are not limited to, aluminum, copper, gold, and silver. The material of the semiconductor layer 15 can be, but is not limited to, amorphous silicon (a-Si), microcrystalline silicon (mc-Si), germanium (Ge), gallium arsenide (GaAs), and gallium nitride (GaN). The material of the ohmic contact layer 16 can be, but is not limited to, aluminum, gold, silver, tungsten, and magnesium. Since the processes of the capacitive ultrasonic transducer 20 are compatible with the processes of the thin-film transistor 30, the process steps for simultaneously manufacturing the ultrasonic transducer 20 and the thin-film transistor 30 will be less than the number of the process steps required for individually manufacturing the ultrasonic transducer 20 and the thin-film transistor 30.

Figure 12:
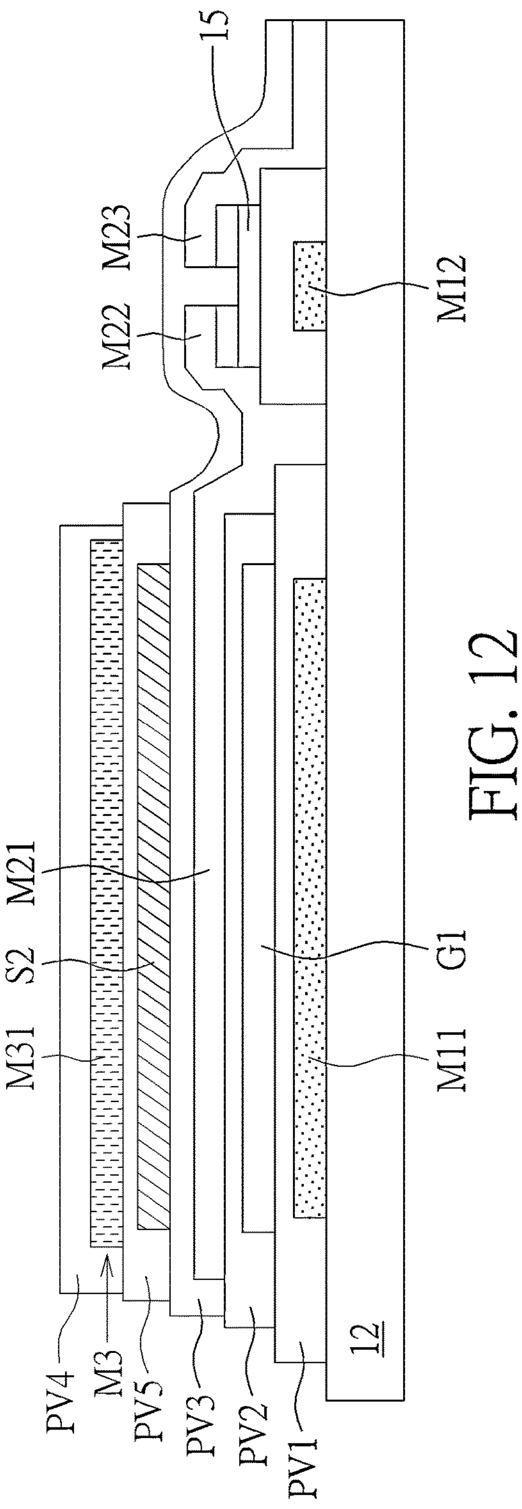
FIGS. 12 to 13 are schematic diagrams used to illustrate the processes of manufacturing an ultrasonic sensor in accordance with another embodiment of the present invention.
Figure 13:
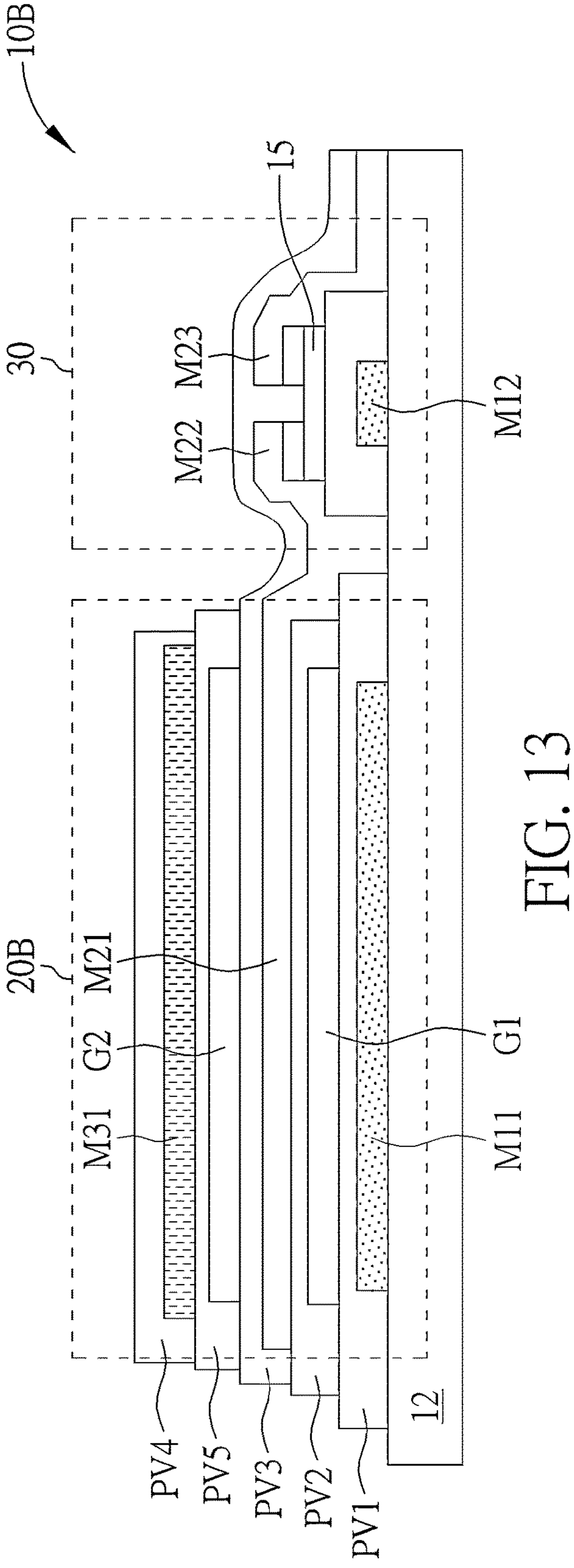

In the aforementioned embodiment, the capacitance micromachined ultrasonic transducer (CMUT) 20 has a single cavity (i.e., the first cavity G1), but this invention is also applicable to each CMUT having a plurality of cavities. Please refer to FIGS. 12 to 13, which are schematic diagrams used to illustrate the processes of manufacturing an ultrasonic sensor 10B in accordance with another embodiment of the present invention. In this embodiment, a second sacrificial layer S2 is first formed above the third insulating layer PV3, and then the third metal layer M3 is formed. As shown in FIG. 12, the second sacrificial layer S2 is formed on the third insulating layer PV3, and the fifth insulating layer PV5 is formed on the second sacrificial layer S2. The third metal layer M3 is then formed on the fifth insulating layer PV5, and the fourth insulating layer PV4 is formed on the third metal layer M3. Afterwards, as shown in FIG. 13, the second sacrificial layer S2 is removed, forming a second cavity G2 between the third insulating layer PV3 and the fifth insulating layer PV5. The method of removing the second sacrificial layer S2 is similar to the method of removing the first sacrificial layer S1 mentioned above. A hole communicating with the space where the second sacrificial layer S2 is located can be formed in the fourth insulating layer PV4 and the fifth insulating layer PV5 first, and then an etching material can be used to etch the second sacrificial layer S2 through the hole, to remove the second sacrificial layer S2, thereby forming the second cavity G2. The second cavity G2 and the first cavity G1 at least partially overlap along the vertical direction, and the first portion M11 of the first metal layer M1, the first cavity G1, the first portion M21 of the second metal layer M2, the second cavity G2, and the first portion M31 of the third metal layer M3 form the CMUT 20B of the ultrasonic sensor 10B. The control method of the ultrasonic sensor 10B is the same as that of the ultrasonic sensor 10, which can refer to the above description about applying the control signal Vg, the reference voltage Vgn, the DC voltage Vdc, and the AC voltage Vac, and will not be further described here. Compared with the single-cavity CMUT 20, the sound wave generated by the dual-cavity CMUT 20B will have a larger amplitude, and the amplitude of the AC voltage generated by the dual-cavity CMUT 20B in the receive mode will also be larger.

In summary, in the embodiments of the invention, the ultrasonic sensor applies the DC voltage and the AC voltage separately to the first portion of the second metal layer and the first portion of the third metal layer. The DC voltage is supplied to the first portion of the second metal layer through the thin-film transistor. Therefore, when the ultrasonic sensor is in the transmission mode, it can accurately control the timing of applying the DC voltage and the AC voltage, enabling the ultrasonic sensor to generate sound waves with a higher accuracy. Furthermore, when the ultrasonic sensor is in the receive mode, it can accurately control the timing of applying the DC voltage, enabling the ultrasonic sensor to receive sound waves more precisely, thereby improving the signal-to-noise ratio of the ultrasonic sensor.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An ultrasonic sensor, comprising:
- a substrate;
- a first metal layer formed on the substrate, a first portion of the first metal layer being used to receive a reference voltage;
- a first insulating layer formed on the first metal layer;
- a second insulating layer forming a first cavity with the first insulating layer;
- a second metal layer formed on the second insulating layer, a first portion of the second metal layer being used to receive a direct-current (DC) voltage different from the reference voltage;
- a third insulating layer formed on the second metal layer;
- a third metal layer formed on the third insulating layer, a first portion of the third metal layer being used to receive an alternating-current (AC) voltage;
- a fourth insulating layer formed on the third metal layer, wherein the first portion of the first metal layer, the first cavity, the first portion of the second metal layer, and the first portion of the third metal layer form a capacitance micromachined ultrasonic transducer (CMUT); and
- a semiconductor layer formed between the substrate and the second metal layer, wherein the semiconductor layer, a second portion of the first metal layer, a second portion of the second metal layer and a third portion of the second metal layer form a thin film transistor;
- wherein the second portion of the second metal layer is coupled to the first portion of the second metal layer, the third portion of the second metal layer is used to receive the DC voltage, and the second portion of the first metal layer controls electrical connection between the second portion of the second metal layer and the third portion of the second metal layer according to a control signal.

2. The ultrasonic sensor of claim 1, wherein the first portion of the first metal layer, the first portion of the second metal layer, the first portion of the third metal layer and the first cavity at least partially overlap along a vertical direction.

3. The ultrasonic sensor of claim 2, further comprising a fifth insulating layer formed under the third metal layer and forming a second cavity with the third insulating layer, wherein the first portion of the first metal layer, the first portion of the second metal layer, the first portion of the third metal layer, the first cavity and the second cavity at least partially overlap along the vertical direction.

4. The ultrasonic sensor of claim 1, wherein the reference voltage is a ground voltage.

5. A method for manufacturing an ultrasonic sensor, comprising:

providing a substrate;

forming a first metal layer on the substrate, the first metal layer comprising a first portion and a second portion;

forming a first insulating layer on the first metal layer;

forming a semiconductor layer on the substrate and the second portion of the first metal layer;

forming a first sacrificial layer on the first insulating layer;

forming a second insulating layer on the first sacrificial layer;

removing the first sacrificial layer to form a first cavity between the first insulating layer and the second insulating layer;

forming a second metal layer on the second insulating layer;

forming a third insulating layer on the second metal layer;

forming a third metal layer on the third insulating layer; and forming a fourth insulating layer on the third metal layer;

wherein the first portion of the first metal layer, the first cavity, a first portion of the second metal layer and a first portion of the third metal layer form a capacitance micromachined ultrasonic transducer (CMUT);

wherein the second portion of the first metal layer, the semiconductor layer, a second portion of the second metal layer and a third portion of the second metal layer form a thin film transistor; and wherein the second portion of the second metal layer is coupled to the first portion of the second metal layer, the third portion of the second metal layer is used to receive a direct-current (DC) voltage, and the second portion of the first metal layer is used to control electrical connection between the second portion of the second metal layer and the third portion of the second metal layer according to a control signal.

6. The method of claim 5, further comprising:

forming a second sacrificial layer on the third insulating layer;

forming a fifth insulating layer on the second sacrificial layer; and removing the second sacrificial layer to form a second cavity between the third insulating layer and the fifth insulating layer.

* * * * *